United States Patent
Ku et al.

(10) Patent No.: US 10,250,275 B2
(45) Date of Patent: Apr. 2, 2019

(54) DIGITAL VOLTAGE SAMPLING

(71) Applicant: Hewlett Packard Enterprise Development LP, Houston, TX (US)

(72) Inventors: Chung-Ping Ku, Taipei (TW); Mohamed Amin Bemat, Cypress, TX (US)

(73) Assignee: HEWLETT PACKARD ENTERPRISES DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/567,806

(22) PCT Filed: Jul. 2, 2015

(86) PCT No.: PCT/US2015/039128
§ 371 (c)(1),
(2) Date: Oct. 19, 2017

(87) PCT Pub. No.: WO2017/003492
PCT Pub. Date: Jan. 5, 2017

(65) Prior Publication Data
US 2018/0097526 A1    Apr. 5, 2018

(51) Int. Cl.
*H03M 1/12* (2006.01)
*G01R 19/25* (2006.01)

(52) U.S. Cl.
CPC ...... *H03M 1/1245* (2013.01); *G01R 19/2503* (2013.01); *G01R 19/2509* (2013.01); *H03M 2201/715* (2013.01)

(58) Field of Classification Search
CPC .......... H03M 1/365; H03M 1/56; H03M 1/14; H03M 1/12; H03M 1/468; H03M 1/1215;
(Continued)

(56) References Cited

U.S. PATENT DOCUMENTS 3,790,947 A * 2/1974 Campbell ............. H03M 1/124
341/131
4,069,479 A * 1/1978 Carpenter ............. H03M 1/069
324/115

(Continued)

OTHER PUBLICATIONS

Amir Zjajo and Jose Pineda De Gyvez, "Low-Power High-Resolution Analog to Digital Converters: Chapter 2: Analog to Digital Conversion," 2011, pp. 11-40, Springer Science+ Business Media B.V.

(Continued)

*Primary Examiner* — Linh Nguyen
(74) *Attorney, Agent, or Firm* — Hewlett Packard Enterprise Patent Department

(57) ABSTRACT

According to some examples, systems and methods are provided for voltage sampling using one or more analog-to-digital converters (ADCs) to sense divided portions of a sampled voltage (e.g., of an output signal), using the one or more analog-to-digital converters to provide a plurality of digital values representative of those divided portions, and combining the plurality of digital values to produce a total digital value representative of the sampled voltage. Such systems and methods can achieve a high resolution for the total digital value while permitting use of ADCs that have a resolution lower than would otherwise be required to achieve the high resolution.

15 Claims, 7 Drawing Sheets

(58) Field of Classification Search
CPC ...... H03M 1/144; H03M 1/145; H03M 1/146;
H03M 1/141; H03M 1/164; H03M 1/46;
H03M 1/002; H03M 1/124; H03M 1/36;
H03M 1/06
USPC .................................................. 341/155, 156
See application file for complete search history.

(56) References Cited

U.S. PATENT DOCUMENTS

| | | | |
|---|---|---|---|
| 4,733,217 A | 3/1988 | Dingwall | |
| 4,804,939 A * | 2/1989 | Cake | H03M 1/56 |
| | | | 324/99 D |
| 4,947,168 A * | 8/1990 | Myers | H03M 1/1042 |
| | | | 341/120 |
| 5,070,332 A | 12/1991 | Kaller et al. | |
| 5,353,027 A * | 10/1994 | Vorenkamp | H03M 1/069 |
| | | | 341/118 |
| 5,585,796 A | 12/1996 | Svensson et al. | |
| 5,726,653 A | 3/1998 | Hsu et al. | |
| 6,177,899 B1 * | 1/2001 | Hsu | H03M 1/144 |
| | | | 341/156 |
| 6,342,850 B1 * | 1/2002 | Borer | H03M 1/14 |
| | | | 341/155 |
| 6,674,379 B1 | 1/2004 | Li | |
| 7,554,310 B2 | 6/2009 | Chapuis | |
| 8,896,474 B2 | 11/2014 | Makinwa | |
| 9,893,740 B1 * | 2/2018 | Ramakrishnan | H03M 1/144 |
| 2003/0218556 A1 * | 11/2003 | van der Goes | H03K 17/04106 |
| | | | 341/156 |
| 2006/0124876 A1 * | 6/2006 | Kahlert | G01T 1/2014 |
| | | | 250/584 |
| 2008/0150779 A1 | 6/2008 | Sung | |
| 2009/0039973 A1 | 2/2009 | Kitayama et al. | |
| 2009/0195432 A1 * | 8/2009 | Bailey | H03M 1/146 |
| | | | 341/156 |
| 2010/0001699 A1 * | 1/2010 | Dragojevic | H02M 3/156 |
| | | | 323/234 |
| 2010/0103010 A1 | 4/2010 | Zhuang | |
| 2010/0176980 A1 | 7/2010 | Breitschadel et al. | |
| 2010/0182175 A1 * | 7/2010 | Oo | H03M 1/1014 |
| | | | 341/120 |
| 2013/0194120 A1 * | 8/2013 | El-Chammas | H03M 1/141 |
| | | | 341/156 |

OTHER PUBLICATIONS

Extended European Search Report, EP Application No, 15897366.5, dated Feb. 23, 2018, pp. 1-7, EPO.

International Search Report and Written Opinion, International Application No. PCT/US2015/039128, dated Apr. 4, 2016, pp. 1-9, KIPO.

* cited by examiner

DIGITAL VOLTAGE SAMPLING

BACKGROUND

Electric power converters (hereafter, power converters) and the like often use feedback from their output to adjust their operation. This is generally referred to as feedback control of the power converter. To implement the feedback control, a mechanism is generally utilized to sample the output from the power converter and to analyze the sampled output (e.g., voltage measured). Based on the analysis, a set of adjustments to the power converter can be determined and submitted to the power converter, thereby resulting in adjusted output. Additionally, feedback control of a power converter can involve continuous adjustments to achieve a desired output.

BRIEF DESCRIPTION OF THE DRAWINGS

Certain examples are described in the following detailed description in sampled to the following drawings.

DETAILED DESCRIPTION

Figure 1:
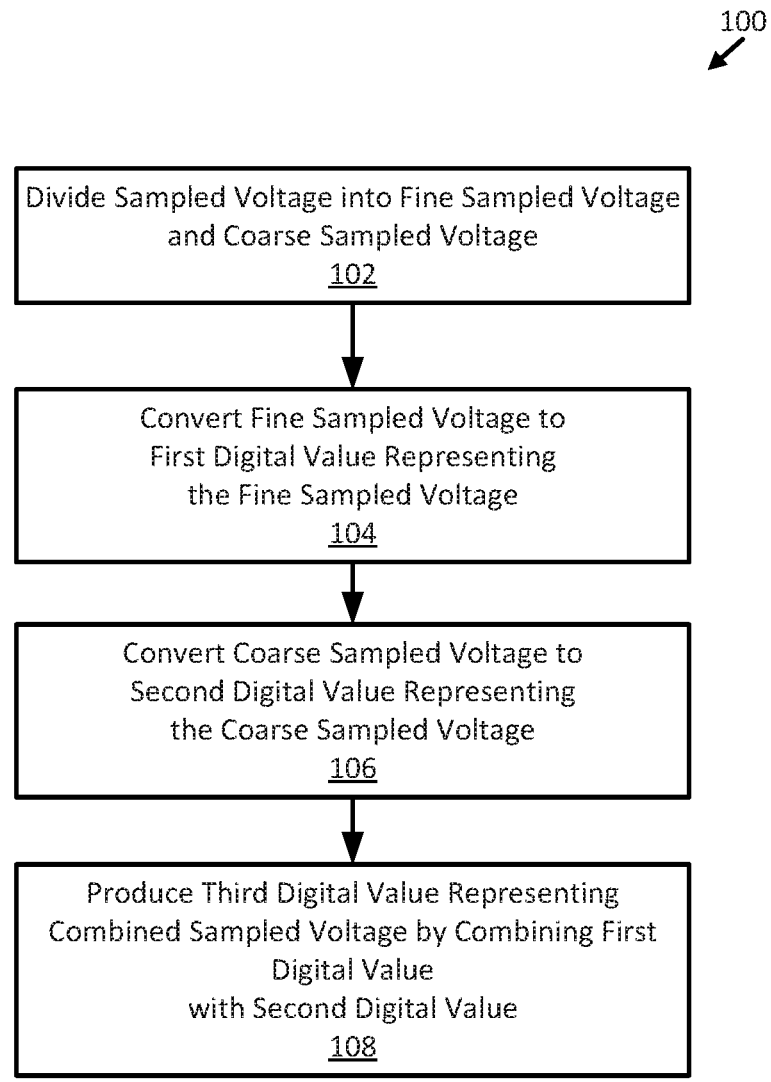
FIGS. 1 and 2 are flowcharts illustrating example methods for sampling voltage according to the present disclosure.

Usually, a feedback signal in a digitally-controlled power supply needs sufficient resolution (e.g., resolution of the voltage measurement of the feedback signal) for the digitally-controlled power supply to achieve accurate operation (e.g., precision control). For instance, with proper resolution, a digitally-controlled power supply can detect small changes to the feedback signal and dynamically regulate itself accordingly to address those small changes. Proper resolution can allow a digitally-controlled power supply to trim the voltage being outputted with better precision to address changes in electrical load.

Some examples described herein provide for staged sampling of an output signal to achieve high-resolution measurement (e.g., voltage measurement) of the output signal, and to achieve this high-resolution measurement without the use of a high-resolution analog-to-digital (ADC) traditionally needed to do so. In particular, some examples can achieve high-resolution measurement of the output signal while using one or more lower-resolution ADCs typically utilized by the industry in constructing digitally-controlled power supplies. The lower-resolution ADCs utilized by a given example may have a lower total cost than a single high-resolution ADC that would otherwise be needed to achieve high-resolution measurement. For instance, some systems and methods described herein may utilize one or two lower resolution ADCs (e.g. 10 bit resolution) to measure an output signal (e.g., of a digitally-controlled power supply) at a predetermined resolution, and may utilize those lower resolution ADCs in place of a single, higher-resolution ADC (e.g., 16-bit ADC) to obtain the measurement. With the high-resolution measurement, a digitally-controlled power supply (or the like) can improve the resolution of a feedback signal used within the digitally-controlled power supply, which in turn can improve precision of its operation.

Various examples provide for systems and methods for voltage sampling using one or more analog-to-digital converters (ADCs) to sense divided portions of a sampled voltage (e.g., of an output signal), using the one or more analog-to-digital converters to provide a plurality of digital values representative of those divided portions, and combining the plurality of digital values to produce a total digital value representative of the sampled voltage. Such systems and methods can achieve a high resolution for the total digital value while permitting use of ADCs that have a resolution lower than would otherwise be required to achieve the high resolution. Generally, the total cost of the one or more lower-resolution ADCs utilized by various systems and methods described herein have a lower total cost than the single higher resolution ADC that would be needed to achieve the same high resolution.

For particular examples, the voltage sampling described herein uses one or more lower-resolution resolution analog-to-digital converters (e.g., 10-bit or 12-bit ADCs) to sense the portions of the sampled voltage and to provide the plurality of digital values representative of those portions. The resolution of the total digital value achieved by various examples may be higher than what can be achieved by using any one of the one or more lower-resolution ADCs alone to sense the entirety of the sampled voltage. Further, the resolution of the total digital value achieved by various examples may be equal to or higher than the resolution achieved using a higher-resolution ADC (e.g., 16-bit) to sense the entirety of the sampled voltage. Consequently, various examples can provide a digital value (representative of a sampled voltage) having a high resolution, previously achieved using a higher-resolution ADC, now being achieved using one or more lower-resolution ADCs, which have a lower cost than their higher-resolution counterparts.

According to some examples, a first ADC is utilized to sense a sampled voltage divided by a set of resistors as a coarse sampled voltage, and a second ADC is utilized to sense the remainder of the sampled voltage (e.g., provided by a differential amplifier) as a fine sampled voltage. Since the sum of the coarse sampled voltage and the fine sampled voltage equals the total sampled voltage (e.g., the coarse signal plus the fine signal is the total feedback signal), the digital values provided by the first and second ADCs can be combined to provide a digital value representing the sampled voltage. As described herein, the resolution of this digital value may be higher than what can be achieved by using either first ADC or the second ADC alone to sense the sampled voltage, and may be higher than what can be achieved by sensing the sampled voltage using a single ADC (e.g., 16-bit) having a higher-resolution than each of the first and second ADCs.

According to various examples, a shared ADC is utilized at a first time to sense a sampled voltage divided by a set of resistors as a coarse sampled voltage, and the shared ADC is utilized at a second time to sense the remainder of the sampled voltage (e.g., provided by a differential amplifier) as a fine sampled voltage (e.g., a fine signal). A switching mechanism may facilitate the shared analog-to-digital converter to be used with the fine sampled voltage at a first time, and to be used with the coarse sampled voltage at a second time. The results of the shared ADC at the first time may be combined with the result of the shared ADC at a second time to produce a digital value representative of the sampled voltage. The resolution of this digital value may be higher than what can be achieved by using the shared ADC to sense the sampled voltage all at once, and may be higher than what can be achieved by sensing the sampled voltage using a single ADC (e.g., 16-bit) having a higher-resolution than the shared ADC.

With respect to applications, the systems and methods provided can be utilized to improve the resolution of a feedback signal, such as that of a digitally-controlled electric power supply (hereafter, power supply), without use of a higher-cost ADC. For instance, the sampled voltage may be that of a feedback signal from a power converter of the power supply, where two ADCs or a single-shared ADC is utilized to sense the feedback signal divided by a resistor as a coarse signal, and to sense the remainder of the feedback signal (e.g., provided by a differential amplifier) as a fine signal. The coarse signal plus the fine signal is the total the feedback signal. When the power converter is operated in regulation, the fine signal can be used to fine-tune the output voltage of the power converter and can rapidly detect the voltage change during load/line transient conditions. In this way, systems and methods described herein can permit allow for staged signal sampling to improve the resolution of feedback signal in the digital-controlled power supply, and do so without the need for a higher-cost ADC.

FIG. 1 is a flowchart illustrating an example method 100 for sampling voltage according to the present disclosure. For some examples, the method 100 may be one performed with respect to a device that utilizes feedback control to adjust its output, such as a power supply. Depending on the example, the method 100 may be implemented in the form of executable instructions stored on a machine-readable medium or in the form of electronic circuitry. For some examples, the operations performed or the order in which operations are performed may differ from what is illustrated by FIG. 1.

The method 100 may begin at block 102 by dividing a sampled voltage into a fine sampled voltage and a coarse sampled voltage. For some examples, the sampled voltage may be one sampled from an output of a power converter or another electronic device. For some examples, the sample voltage is sampled from an output signal. A set of components including a resistor, a capacitor, a differential amplifier (e.g., differential operational amplifier), or the like may be utilized to divide the sampled voltage to the fine sampled voltage and the coarse sampled voltage.

The method 100 continues with block 104 by converting a fine sampled voltage, from block 102, to a first digital value representing the fine sampled voltage. A lower-resolution analog-to-digital converter (e.g., 10-bit analog-to-digital converter rather than a 16-bit one) may be utilized to convert the fine sampled voltage to the first digital value. For various examples, the first digital value representing the fine sampled voltage provides a voltage measurement of the fine sampled voltage. Additionally, for some examples, the sample voltage is sampled from an output signal and, as a result, the fine sampled voltage may be a signal (i.e., a fine sampled signal). As described herein, the fine sampled voltage, once combined with the coarse sampled voltage, may be utilized herein to fine-tune the operation of an electronic device, such as a power converter and its output during load/line transient conditions.

For some examples, converting the fine sampled voltage to the first digital value comprises first scaling down the fine sampled voltage to a scaled fine sampled voltage. The fine sampled voltage may be scaled down based on a maximum voltage sense level associated with the analog-to-digital converter (ADC) that is to be used at block 104 to produce the first digital value. For instance, the ADC utilized at block 104 may have a maximum voltage sense level of 3.3V and, as such, the fine sampled voltage can be scaled down by a factor of 3.3V. Eventually, the ADC (having the maximum voltage sense level) can be used to convert the scaled fine sampled voltage to the first digital value.

The method 100 continues with block 106 by converting a coarse sampled voltage, from block 102, to a second digital value representing the coarse sampled voltage. A lower-resolution analog-to-digital converter (e.g., 10-bit analog-to-digital converter rather than a 16-bit one) may be utilized to convert the coarse sampled voltage to the second digital value. For some examples, the analog-to-digital converter used at block 106 may be the same as the one used by block 104 (e.g., shared based on time). For various examples, the second digital value representing the coarse sampled voltage provides a voltage measurement of the coarse sampled voltage. Additionally, for some examples, the sample voltage is sampled from an output signal and, as a result, the coarse sampled voltage may be a signal (i.e., coarse sampled signal). Notwithstanding FIG. 1, the coarse sampled voltage may be converted to the second digital value before, in parallel with, or after the fine sampled voltage is converted to the first digital value.

For some examples, converting the coarse sampled voltage to the second digital value comprises first scaling down the coarse sampled voltage to a scaled coarse sampled voltage. The coarse sampled voltage may be scaled down based on a maximum voltage sense level associated with the analog-to-digital converter (ADC) that is to be used at block 106 to produce the second digital value. For instance, the ADC utilized at block 106 may have a maximum voltage sense level of 3.3V and, as such, the coarse sampled voltage can be scaled down by a factor of 3.3V. Eventually, the ADC (having the maximum voltage sense level) can be used to convert the scaled coarse sampled voltage to the second digital value.

The method 100 continues with block 108 by producing a third digital value representing the combined sampled voltage and may do so by combining the first digital value, from block 104, with the second digital value, from block 106. For various examples, the third digital value representing the combined sampled voltage provides a voltage measurement of the sampled voltage. As described herein, the resolution of this third digital value may be equal to or greater than the resolution of a digital value of the sample voltage obtained using a single analog-to-digital converter having a higher bit-resolution than those used in blocks 104 and 106.

Figure 2:
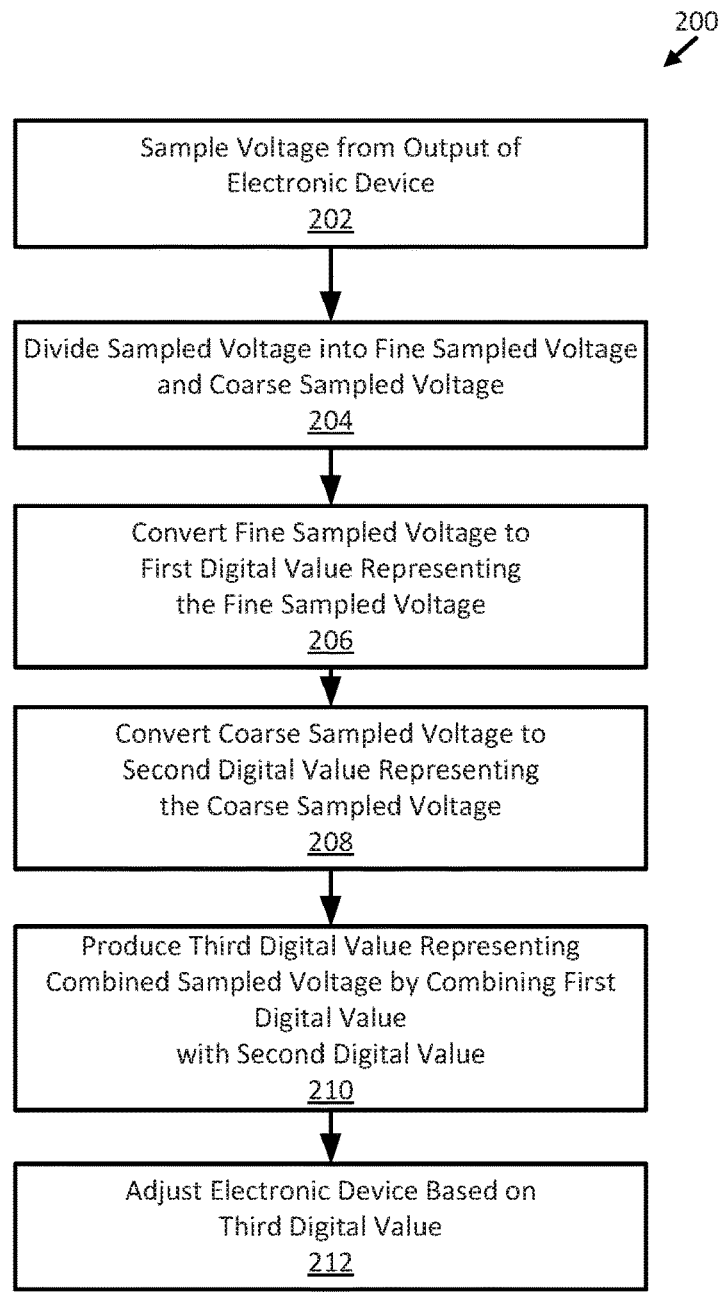

FIG. 2 is a flowchart illustrating an example method 200 for sampling voltage according to the present disclosure. For some examples, the method 200 may be one performed with respect to an electronic device, such as a power converter of a power supply having feedback control. Depending on the example, the method 200 may be implemented in the form of executable instructions stored on a machine-readable medium or in the form of electronic circuitry. For some examples, the operations performed or the order in which operations are performed may differ from what is illustrated by FIG. 2.

The method 200 may begin at block 202 by sampling a voltage of an output of an electronic device, such as a power converter of a digital-controlled power supply. Depending on the example, the sample voltage may be obtained from the output using a directional coupler or the like, which may be coupled to an output port of the electronic device.

The method 200 continues with block 204 by dividing the sampled voltage, from block 202, into a fine sampled voltage and a coarse sampled voltage. The method 200 continues to block 206 by converting a fine sampled voltage, from block 204, to a first digital value representing the fine sampled voltage. Likewise, at block 208, the method 200 continues by converting a coarse sampled voltage, from block 204, to a second digital value representing the coarse sampled voltage. Notwithstanding FIG. 2, the coarse sampled voltage may be converted to the second digital value before, in parallel with, or after the fine sampled voltage is converted to the first digital value.

The method 200 continues with block 210 by producing a third digital value representing the sampled voltage and may do so by combining the first digital value, from block 206, with the second digital value, from block 208. At block 212 the method 200 continues by adjusting the electronic device (e.g., power converter) based on the third digital value produced at block 210. For some examples, adjusting the electronic device based on the third digital value comprises comparing the third digital value to a sampled digital value representing a desired voltage (e.g., desired voltage output from the power converter) and causing the electronic device to compensate for the difference between the two digital values (e.g., reduce or eliminate the difference over multiple feedback iterations).

Figure 3:
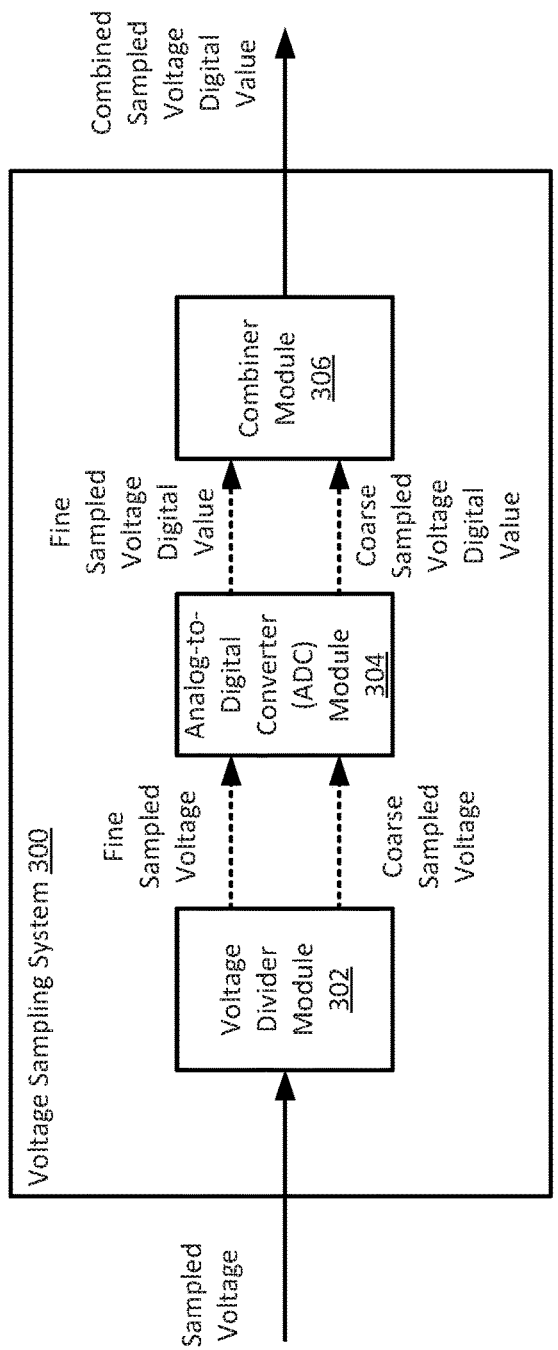
FIG. 3 is a block diagram illustrating an example voltage sampling system according to the present disclosure.

FIG. 3 is a block diagram illustrating an example voltage sampling system 300 according to the present disclosure. For some examples, the voltage sampling system 300 is part of an electronic device that utilizes voltage sampling, such a power supply including feedback control. As shown, the voltage sampling system 300 includes a voltage divider module 302, an analog-to-digital converter (ADC) module 304, and a combiner module 306. In various examples, the components or the arrangement of components in the voltage sampling system 300 may differ from what is depicted in FIG. 3.

As used herein, modules and other components of various examples may comprise, in whole or in part, machine-readable instructions or electronic circuitry. For instance, a module may comprise machine-readable instructions executable by a processor to perform one or more functions in accordance with various examples described herein. Likewise, in another instance, a module may comprise electronic circuitry to perform one or more functions in accordance with various examples described herein. The elements of a module may be combined in a single package, maintained in several packages, or maintained separately.

The voltage divider module 302 may facilitate division of a sampled voltage into a fine sampled voltage and a coarse sampled voltage. For some examples, the voltage divider module 302 includes one or more resistors, capacitors, or differential amplifiers (e.g., differential operational amplifier) that provide for the fine and coarse sampled voltages from the sampled voltage. The voltage divider module 302 may scale down the fine sampled voltage before the fine sampled voltage is provided to the analog-to-digital converter (ADC) module 304. Additionally, the voltage divider module 302 may scale down the coarse sampled voltage before the coarse sampled voltage is provided to the ADC module 304. When scaling down the fine sampled voltage, the fine sampled voltage may be scaled down based on a maximum voltage sense level associated with an analog-to-digital converter (ADC) included by the ADC module 304 to produce the first digital value. Likewise, when scaling down the coarse sampled voltage, the coarse sampled voltage may be scaled down based on a maximum voltage sense level associated with an analog-to-digital converter (ADC) included by the ADC module 304 to produce the second digital value.

The analog-to-digital converter (ADC) module 304 may facilitate conversion of a sampled voltage to a digital value representing the sampled voltage. For instance, the ADC module 304 may convert the fine sampled voltage, provided by the voltage divider module 302, to a first digital value representing the fine sampled voltage, and convert the coarse sampled voltage, provided by the voltage divider module 302, to a second digital value representing the fine sampled voltage. Depending on the example, the ADC module 304 may convert the fine sampled voltage and coarse sampled voltage may be converted to their respective digital values in parallel (e.g., simultaneously) or sequentially. According to various examples, the ADC module 304 includes one or more analog-to-digital converters (ADCs), which can include digital signal processors. Further, as described herein, the one or more ADCs included by the ADC module 304 may have a lower-resolution than would otherwise traditionally be needed to obtain a high-resolution measurement of the sampled voltage. As described herein, the digital value representing the sampled voltage may provide a voltage measurement for the sampled voltage.

The combiner module 306 may facilitate production of a third digital value by combining the first digital value from the ADC module 304 with the second digital value from the ADC module 304. As described herein, the third digital value may represent the sampled voltage and, more specifically, may be a digital value representing a voltage measurement of the sampled voltage. To combine the digital values, the combiner module 306 may include an adder, summer, or the like. For some examples, the third digital value provided by the combiner module 306 provides is used in generating a control signal used to adjust the operation of an electronic device (e.g., power converter).

Figure 4:
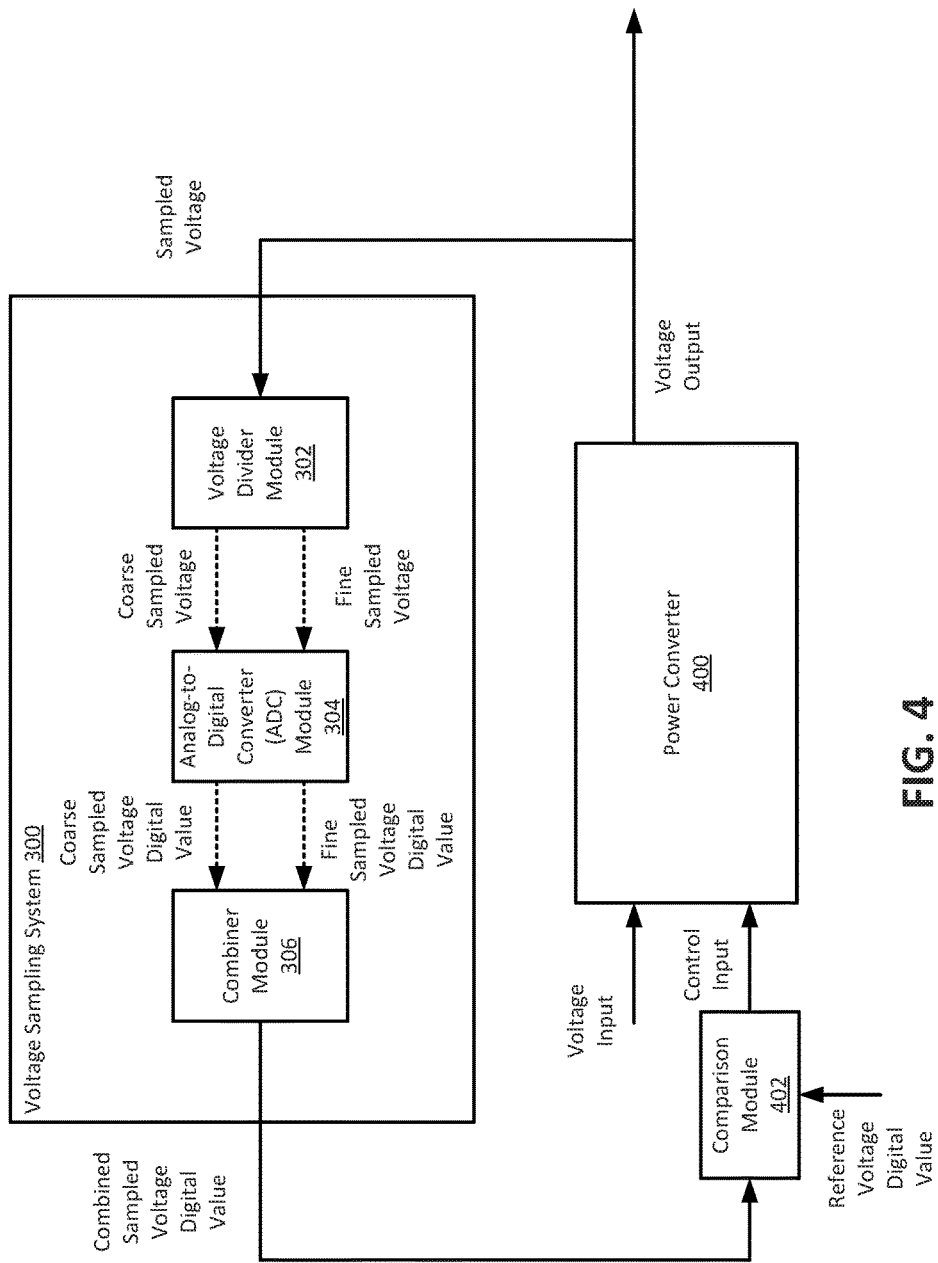
FIG. 4 is a block diagram illustrating an example power converter utilizing an example voltage sampling system according to the present disclosure.

FIG. 4 is a block diagram illustrating an example power converter 400 utilizing the example voltage sampling system 300 according to the present disclosure. In particular, FIG. 4 represents an example of implementing the voltage sample system 300 as part of a feedback control of the power converter 400. As shown in FIG. 4, the power converter 404 includes a voltage input to receive an input signal, a voltage output to provide an output signal based on power converting the input signal, and a control input to control power conversion of the input signal to the output signal. The voltage sampling system 300 is coupled to the power converter 400 such that the voltage sampling system 300 can obtain a sample voltage (e.g., sample signal) from the output signal provided by the voltage output. The sample voltage may be obtain from the voltage output by way of a directional coupler coupled to the voltage output.

As further shown in FIG. 4, the voltage sampling system 300 is coupled to the power converter 400 such that a digital value representing the sampled voltage (hereafter, sampled voltage digital value) produced by the voltage sampling system 300 can be provided to the power converter 400 by way of a comparison module 402. According to some examples, the comparison module 402 receives the sampled voltage digital value from the voltage sampling system 300, receives a sampled voltage digital value, and compares the sampled voltage digital value to the sampled voltage digital value. The sampled voltage digital value can represent the output voltage desired from the power converter 400, while the sampled voltage digital value represents the output voltage being provided by the power converter 400 (during operation) at or near present time. By the comparison, the comparison module 402 can determine a difference (e.g., error) between the two digital values and generate a control signal intended to cause the power converter 400 to compensate for the difference (e.g., reduce or eliminate the difference).

As illustrated in FIG. 4, the power converter 400 can receive the control signal from the comparison module 402 via the control input of the power converter 400. Depending on the example, the control signal may comprise a pulse-width modulated signal generated by the comparison module 402 based on the difference between the sampled voltage digital value and the sampled voltage digital value.

Figure 5:
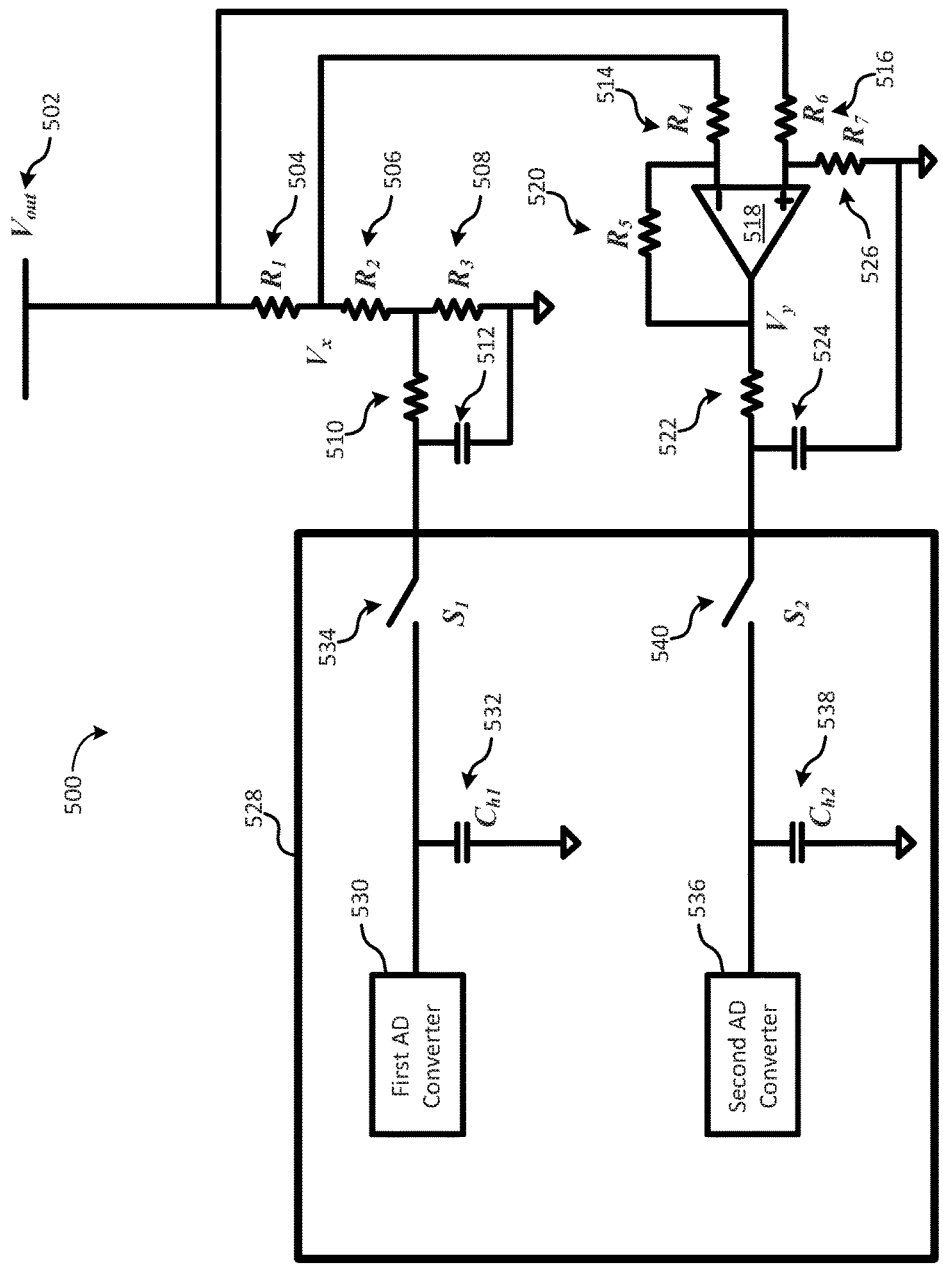
FIGS. 5 and 6 are diagrams illustrating example voltage sampling devices according to the present disclosure.

FIG. 5 is a diagram illustrating an example voltage sampling device 500 according to the present disclosure. According to some examples, the voltage sampling device 500 performs operations according to the method 100 described above with respect to FIG. 1. Additionally, for some examples, the voltage sampling device 500 implements some or all components of a voltage sampling system as described herein (e.g., the voltage sampling system 300 of FIG. 3). As shown in FIG. 5, the voltage sampling device 500 includes an output voltage 502, resistors 504, 506, 508, 510, 514, 516, 520, 522, 526, capacitors 512, 524, an operational amplifier 518, and a voltage sampling module 528. As also shown, the voltage sampling module 528 includes analog-to-digital converters 530, capacitors 532, 538, and switches 534, 540.

Depending on the example, the output voltage 502 may be coupled to an output of an electronic device, such a power converter. During operation, a voltage (e.g., 12V) may be sampled from the output voltage $V_{out}$ (502) and divided across resistors R1, R2, and R3 (504, 506, 508 respectively), which are coupled in series. The voltage may be sampled from the output voltage $V_{out}$ (502) through a coupler (not shown) attached to the output voltage 502 (e.g., directional coupler). The voltage across R1 may be considered a fine sampled voltage $V_y$ (e.g., 1V) of the sampled voltage, while the voltage across R2 and R3 may be considered a coarse sampled voltage $V_x$ (e.g., 11V) of the sampled voltage. Accordingly, the sum of the fine sampled voltage $V_y$ and the coarse sampled voltage $V_x$ equals the sampled voltage.

To accommodate a maximum voltage sense level associated with the first analog-to digital converter (ADC) 530, the resistance of each of R2 and R3 may be such that R2 and R3 as configured cause the coarse sampled voltage to scale down according to the maximum voltage sense level (hereafter, scaled coarse sampled voltage) before the coarse sampled voltage is provided to the digital controller 728. As such, where the maximum voltage sense level is 3.3V and the coarse sampled voltage $V_x$ is 11V, the resistance of each of R2 and R3 may be such that the coarse sampled voltage is scaled down by 3.3V so that the ADC 530 can properly measure the coarse sampled voltage $V_x$.

As shown, the scaled coarse sampled voltage produced by R2 and R3 may be provided to the voltage sampling module 528 via a resistor-capacitor (RC) filter implemented by the resistor 510 and the capacitor 512. With respect to the fine sampled voltage across R1, the fine sampled voltage may be determined by use of a differential amplifier, which in FIG. 5 is implemented by the resistors R4, R5, R6 (514, 516, 520 respectively) and the operational amplifier 518. The fine sampled voltage, once determined by the differential amplifier, may be provided to the voltage sampling module 528 via a RC filter implemented by the resistor 522 and the capacitor 524.

During operation of the voltage sampling device 500, the voltage sampling module 528 may facilitate the sampling (e.g., measurement) of each of the fine and coarse sampled voltages and may generate digital values representing those sampled voltages (e.g., digital values representing their voltage measurements). For instance, to measure the coarse sampled voltage, the voltage sampling module 528 may first activate the switch S1 (534) to receive the scaled coarse sampled voltage (as scaled by R2 and R3) from the RC filter implemented by the resistor 510 and the capacitor 512. The reception of the scaled coarse sampled voltage through the switch S1 (534) causes the capacitor 532 (the first holding capacitor $C_{h1}$) to be charged by the scaled coarse sampled voltage. After the capacitor 532 has reached the scaled coarse sampled voltage, the switch S1 (534) may be deactivated and the first analog-to-digital converter 530 can convert the scaled coarse sampled voltage stored in the capacitor 532 to a digital value representing the scaled coarse sampled voltage (e.g., digital value representing the voltage measurement of the scaled coarse sampled voltage). By later processes, the digital value representing the scaled coarse sampled voltage may or may not be adjusted (e.g., based on the maximum voltage sensing level) to reverse the scaling applied by way of R2 and R3.

With respect to measuring the fine sampled voltage, the voltage sampling module 528 may first activate the switch S2 (540) to receive the fine sampled voltage from the RC filter implemented by the resistor 522 and the capacitor 524. The reception of the fine sampled voltage through the switch S2 (540) causes the capacitor 538 (the second holding capacitor $C_{h1}$) to be charged by the fine sampled voltage. After the capacitor 538 has reached the fine sampled voltage, the switch S2 (540) may be deactivated and the second analog-to-digital converter 536 can convert the fine sampled voltage stored in the capacitor 538 to a digital value representing the fine sampled voltage (e.g., digital value representing the voltage measurement of the fine sampled voltage).

As described herein, depending on the example, the voltage sampling module 528 may sample and convert the fine sampled voltage and the coarse sampled voltage to digital values in parallel or sequentially.

Figure 6:
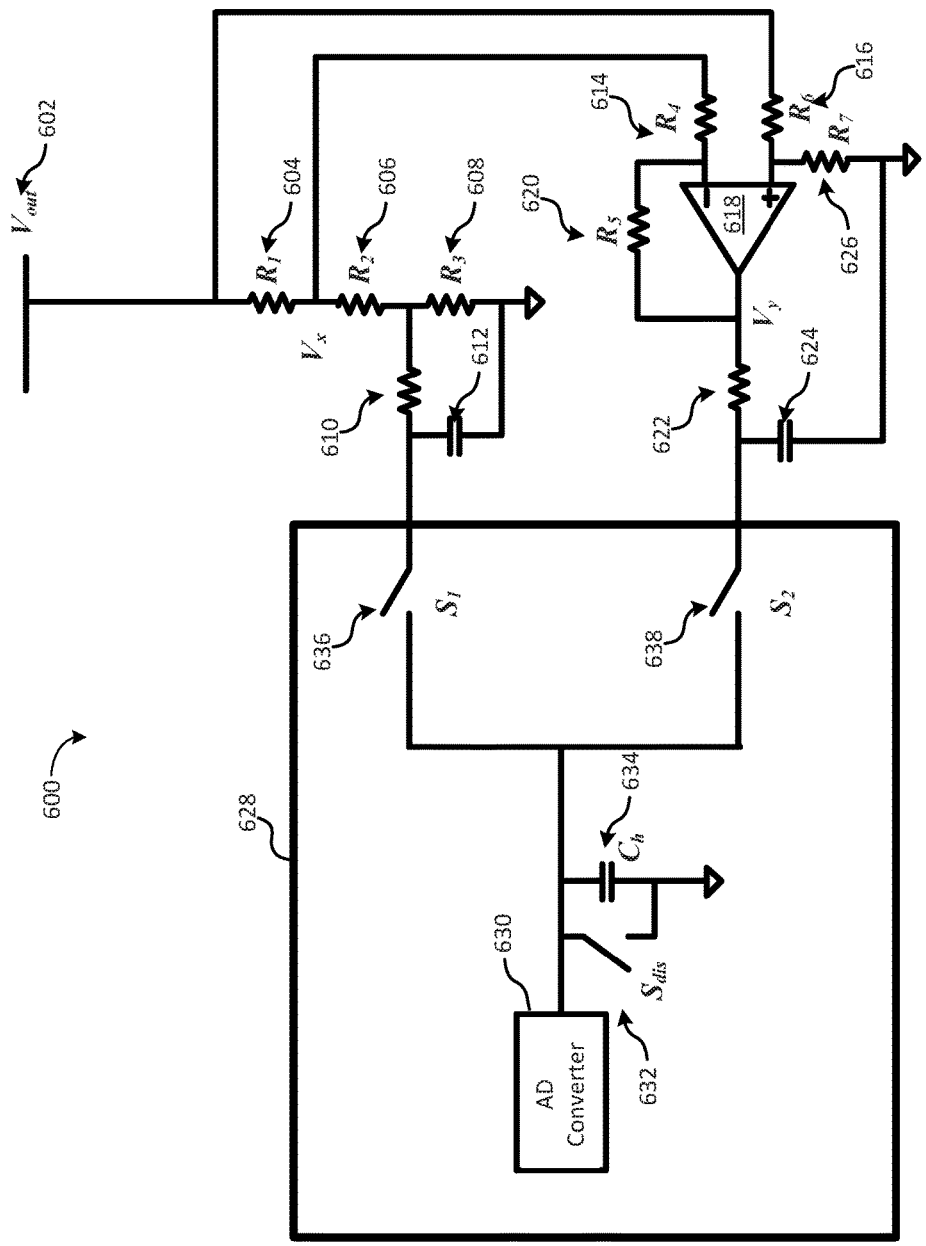

FIG. 6 is a diagram illustrating an example voltage sampling device 600 according to the present disclosure. According to some examples, the voltage sampling device 600 performs operations according to the method 100 described above with respect to FIG. 1. Additionally, for some examples, the voltage sampling device 600 implements some or all components of a voltage sampling system as described herein (e.g., the voltage sampling system 300 of FIG. 3). As shown in FIG. 6, the voltage sampling device 600 includes an output voltage 602, resistors 604, 606, 608, 610, 614, 616, 620, 622, 626, capacitors 612, 624, an operational amplifier 618, and a voltage sampling module 628. As also shown, the voltage sampling module 628 includes an analog-to-digital converter 630, a capacitor 634, and switches 632, 636, 638.

According to some examples, the output voltage 602, the resistors 604, 606, 608, 610, 614, 616, 620, 622, 626, the capacitors 612, 624, and the operational amplifier 618 are similar to, and operate similarly to, the output voltage 502, the resistors 504, 506, 508, 510, 514, 516, 520, 522, 526, the capacitors 512, 524, and the operational amplifier 518 of the voltage sampling device 500 described above with respect to FIG. 5. As such, through the switch S1 (636) of the voltage sampling module 628, the voltage sampling module 628 can receive a scaled coarse sampled voltage through the resistor-capacitor (RC) filter implemented by the resistor 610 and the capacitor 612. Likewise, through the switch S2 (638) of the voltage sampling module 628, the voltage sampling module 628 can receive a fine sampled voltage through the resistor-capacitor (RC) filter implemented by the resistor 622 and the capacitor 624.

During operation of the voltage sampling device 600, the voltage sampling module 628 may facilitate the sampling (e.g., measurement) of each of the fine and coarse sampled voltages and may generate digital values representing those sampled voltages (e.g., digital values representing their voltage measurements). Unlike the voltage sampling module 528 of the voltage sampling device 500 described above with respect to FIG. 5, the voltage sampling module 628 utilizes a single analog-to-digital converter (the analog-to-digital converter 530) in sampling (e.g., measuring) each of the fine sampled voltage and the coarse sampled voltage. In this way, the analog-to-digital converter 530 can be shared by two sampling processes of the voltage sampling module 628.

For some examples, to measure the coarse sampled voltage at time T1, the voltage sampling module 628 ensures that the switch S1 (636) is activated, that the switch S2 (638) is deactivated, and that the switch $S_{dis}$ (632) is deactivated. By activating the switch S1 (636), the voltage sampling module 628 may receive the scaled coarse sampled voltage (as scaled by R2 and R3) from the RC filter implemented by the resistor 610 and the capacitor 612. The reception of the scaled coarse sampled voltage through the switch 31 (636) (while the switch $S_{dis}$ [632] remains deactivated) causes the capacitor 634 (the holding capacitor $C_h$) to be charged by the scaled coarse sampled voltage. After the capacitor 634 has reached the scaled coarse sampled voltage, the switch S1 (636) may be deactivated and the analog-to-digital converter 630 can convert the scaled coarse sampled voltage stored in the capacitor 634 to a digital value representing the scaled coarse sampled voltage (e.g., digital value representing the voltage measurement of the scaled coarse sampled voltage). By later processes, the digital value representing the scaled coarse sampled voltage may or may not be adjusted (e.g., based on the maximum voltage sensing level) to reverse the scaling applied by way of R2 and R3.

Between sampling the two different sampled voltages, the voltage sampling module 628 may first ensure that the capacitor 634 (the holding capacitor $C_h$) has no residual charge from its last sampling. To do this, the voltage sampling module 628 may activate the switch $S_{dis}$ (632) to discharge the capacitor 634, and deactivate the switch $S_{dis}$ (632) after the capacitor 634 has been sufficiently discharged.

With respect to measuring the fine sampled voltage at time T2, the voltage sampling module 628 may ensure that the switch S1 (636) is deactivated, that the switch S2 (638) is activated, and that the switch $S_{dis}$ (632) is deactivated. By activating the switch S2 (638), the voltage sampling module 628 may receive the fine sampled voltage from the RC filter implemented by the resistor 622 and the capacitor 624. The reception of the fine sampled voltage through the switch S2 (638) (while the switch $S_{dis}$ [632] remains deactivated) causes the capacitor 634 (the holding capacitor $C_h$) to be charged by the fine sampled voltage. After the capacitor 638 has reached the fine sampled voltage, the switch S2 (638) may be deactivated and the analog-to-digital converter 630 can convert the fine sampled voltage stored in the capacitor 634 to a digital value representing the fine sampled voltage (e.g., digital value representing the voltage measurement of the fine sampled voltage).

As described herein, the order in which the voltage sampling module 628 samples and converts the fine sampled voltage and the coarse sampled voltage may vary between different examples.

Figure 7:
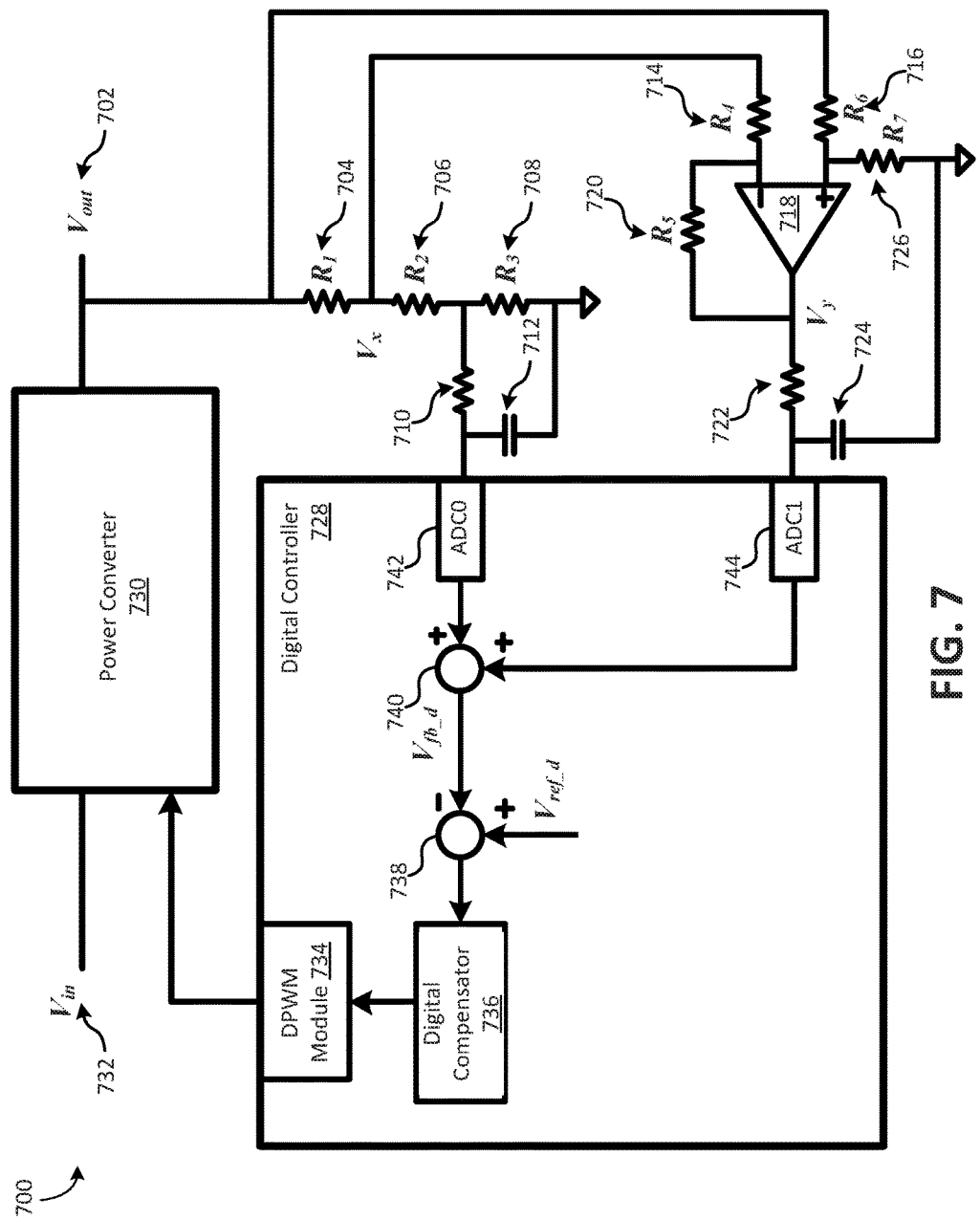
FIG. 7 is a diagram illustrating an example power conversion system including an example power converter utilizing an example voltage sampling device according to the present disclosure.

FIG. 7 is a diagram illustrating an example power conversion system 700 including an example power converter 730 utilizing an example voltage sampling device according to the present disclosure. As shown, the power conversion system 700 includes an output voltage 702 from a power converter 730, resistors 704, 706, 708, 710, 714, 716, 720, 722, 726, capacitors 712, 724, an operational amplifier 718, a digital controller 728, and an input voltage to the power converter 730. As further shown, the digital controller 728 includes a digital pulse-width modulator (DPWM) module 734, a digital compensator 736, a digital comparator 738, a combiner 740, and analog-to-digital converters 742, 744. According to some examples, the example voltage sampling device of FIG. 7 comprises the resistors 704, 706, 708, 710, 714, 716, 720, 722, 726, the capacitors 712, 724, the operational amplifier 718, the analog-to-digital converters 742, 744 of the digital controller 728, and the combiner 740 of the digital controller 728.

According to some examples, the output voltage 702, the resistors 704, 706, 708, 710, 714, 716, 720, 722, 726, the capacitors 712, 724, and the operational amplifier 718 are similar to, and operate similarly to, the output voltage 502, the resistors 504, 506, 508, 510, 514, 516, 520, 522, 526, the capacitors 512, 524, and the operational amplifier 518 of the voltage sampling device 500 described above with respect to FIG. 5. As such, through the analog-to-digital converter (ADC) 742 of the digital controller 728, the digital controller 728 can receive a scaled coarse sampled voltage through the resistor-capacitor (RC) filter implemented by the resistor 710 and the capacitor 712. Likewise, through the analog-to-digital converter (ADC) 744 of the digital controller 728, the digital controller 728 can receive a fine sampled voltage through the RC filter implemented by the resistor 722 and the capacitor 724.

For some examples, the digital controller 728 receives the fine and coarse sampled voltages and generates a control signal to adjust the operation of the power converter 730 based on the fine and coarse sampled voltages. In particular, as shown in FIG. 7, the analog-to-digital converter 742 (ADC0) may receive the scaled coarse sampled voltage, convert the scaled coarse sampled voltage to a digital value representing the scaled coarse sampled voltage, and provide the digital value to the combiner 740. Similarly, the analog-to-digital converter 744 (ADC1) may receive the fine sampled voltage, convert the fine sampled voltage to a digital value representing the scaled coarse sampled voltage, and provide the digital value to the combiner 740.

The combiner 740 can combine the two digital values and provide the combined digital value to the digital comparator 738. In the context of the power conversion system 700, the combined digital value can represent the voltage measurement of a feedback signal. The digital comparator 738 can compare the combined digital value to a digital value representing a sampled voltage (e.g., voltage measurement) desired for the output voltage 702 of the power converter 730. The digital comparator 738 can provide the result of the comparison (e.g., the difference between the digital values) as a digital value to the digital compensator 736.

The digital compensator 736 can treat the digital value received from the digital comparator 738 as an error value of power converter 730. Based on this error value, the digital compensator 736 can generate a digital adjustment for the power converter 730. The digital pulse-width modulator (DPWM) module 734 can receive the digital adjustment from the digital compensator 736, and generate a control signal based on the adjustment. The control signal generated may comprise pulse-width modulated signal, which the power converter 730 may be configured to receive.

Based on the control signal, the power converter 730 may adjust its operation to compensate for the error value determined by the digital comparator 738. During operation of the power conversion system 700, the foregoing process may continue as a continuous feedback control loop, thereby permitting the power converter 730 to continuously adjust its operation to according to the voltage sampled from the output voltage 702.

In the foregoing description, numerous details are set forth to provide an understanding of the subject disclosed herein. However, various examples may be practiced without some or all of these details. Some examples may include modifications and variations from the details discussed above. It is intended that the appended claims cover such modifications and variations.

What is claimed is:

1. A voltage sampling method, comprising:
producing a sampled voltage from an output of an electronic device by a coupler coupled to a first set of resistors and a second set of resistors;
dividing, by a voltage divider, the sampled voltage into a fine sampled voltage and a coarse sampled voltage, the fine sampled voltage provided by an output of a differential amplifier coupled across the first set of resistors;
converting, by a first analog-to digital converter coupled to the output of the differential amplifier, the fine sampled voltage to a first digital value that represents the fine sampled voltage;
converting, by a second analog-to-digital converter coupled to at least one of resistors among a set of second resisters, the coarse sampled voltage to a second digital value that represents the coarse sampled voltage; and
producing a third digital value by combining the first digital value with the second digital value, the third digital value representing the sampled voltage.

2. The voltage sampling method of claim 1, wherein the first analog-to-digital converter includes 10-bit analog-to-digital converter or a 12-bit analog-to-digital converter.

3. The voltage sampling method of claim 1, wherein the second analog-to-digital converter includes a 10-bit analog-to-digital converter or a 12-bit analog-to-digital converter.

4. The voltage sampling method of claim 1, wherein converting, by the first analog-to-digital converter coupled to the output of the differential amplifier, the fine sampled voltage to the first digital value comprises:
scaling down the fine sampled voltage to a scaled fine sampled voltage based on a maximum voltage sense level associated with an analog-to-digital converter; and
converting the scaled fine sampled voltage to the first digital value by the first analog-to-digital converter.

5. The voltage sampling method of claim 1, wherein converting, by the first analog-to-digital converter coupled to the output of the differential amplifier, the coarse sampled voltage to the first digital value comprises:
scaling down the coarse sampled voltage to a scaled coarse sampled voltage based on a maximum voltage sense level associated with the first analog-to-digital converter; and
converting the scaled coarse sampled voltage to the first digital value by the first analog-to-digital converter.

6. The voltage sampling method of claim 1, wherein dividing, by the voltage divider, the sampled voltage into the fine sampled voltage and the coarse sampled voltage comprises determining at least one of the fine sampled voltage or the coarse sampled voltage across by a differential amplifier.

7. The voltage sampling method of claim 1, wherein the sampled voltage is obtained from obtaining the sampled voltage from an output of a power converter; and the method comprises adjusting the power converter based on the third digital value.

8. The voltage sampling method of claim 1, wherein converting the fine sampled voltage to the first digital value comprises converting the fine sampled voltage to the first digital value by analog-to-digital converter at a first time, converting the coarse sampled voltage to the second digital value comprises converting the coarse sampled voltage to the second digital value by the second analog-to-digital converter at a second time, wherein the first analog-to-digital converter and the second analog-to-digital converter are a same converter that is shared and the first time is different from the second time.

9. A voltage sampling system, comprising:
a coupler, coupled to a plurality of resistors, to provide a sampled voltage from an output of an electronic device;
a voltage divider module to divide the sampled voltage into a fine sampled voltage and a coarse sampled voltage, the fine sampled voltage provided by an output of a differential amplifier that is coupled across the first set of resistors;
an analog-to-digital converter module, including at least one analog-to-digital converter that is 12-bit or lower, to:
convert the fine sampled voltage to a first digital value representing the fine sampled voltage; and
convert the coarse sampled voltage to a second digital value representing the coarse sampled voltage; and
a combiner module to produce a third digital value by combining the first digital value with the second digital value, the third digital value representing the sampled voltage.

10. The voltage sampling system of claim 9, wherein the analog-to-digital converter module comprises:
a shared analog-to-digital converter; and
a switching mechanism to provide the shared analog-to-digital converter with the fine sampled voltage at a first time, and to provide the shared analog-to-digital converter with the coarse sampled voltage at a second time.

11. The voltage sampling system of claim 9, wherein the voltage sampling system is included in a power conversion system, the power conversion system including a power converter that is adjusted based on the third digital value provided by the voltage sampling system.

12. The voltage sampling system of claim 9, wherein the voltage divider module is to scale down the fine sampled voltage before the fine sampled voltage is provided to the analog-to-digital converter module, or to scale down the coarse sampled voltage before the coarse sampled voltage is provided to the analog-to-digital converter module.

13. A voltage sampling system, comprising:
a coupler to sample voltage from an output of an electronic device;
a plurality of resistors arranged in series, the plurality of resistors coupled in series to the coupler, the plurality of resistors including a first set of resistors and a second set of resistors;

a differential amplifier having inputs coupled across the first set of resistors, an output of the differential amplifier providing a fine sampled voltage across the first set of resistors;

a first analog-to-digital converter coupled to the output of the differential amplifier, the first analog-to-digital converter providing a first digital value representing the fine sampled voltage; and a second analog-to-digital converter coupled across at least one resistor in the second set of resistors, a coarse sampled voltage being across the second set of resistors, the second analog-to-digital converter providing a second digital value representing the coarse sampled voltage.

14. The voltage sampling system of claim 13, comprising:

a first capacitor coupled to a first input of the first analog-to-digital converter;

a second capacitor coupled to a second input of the second analog-to-digital converter;

a first switch coupled between the first capacitor and the output of the differential amplifier; and a second switch coupled between the second capacitor and the at least one resistor.

15. The voltage sampling system of claim 13, wherein the first analog-to-digital converter and the second analog-to-digital converter are the same analog-to-digital converter, the voltage sampling system comprising:

a capacitor coupled to the same analog-to-digital converter;

a first switch coupled between the capacitor and the output of the differential amplifier; and a second switch coupled between the capacitor and the at least one resistor.

* * * * *